Figure 1:
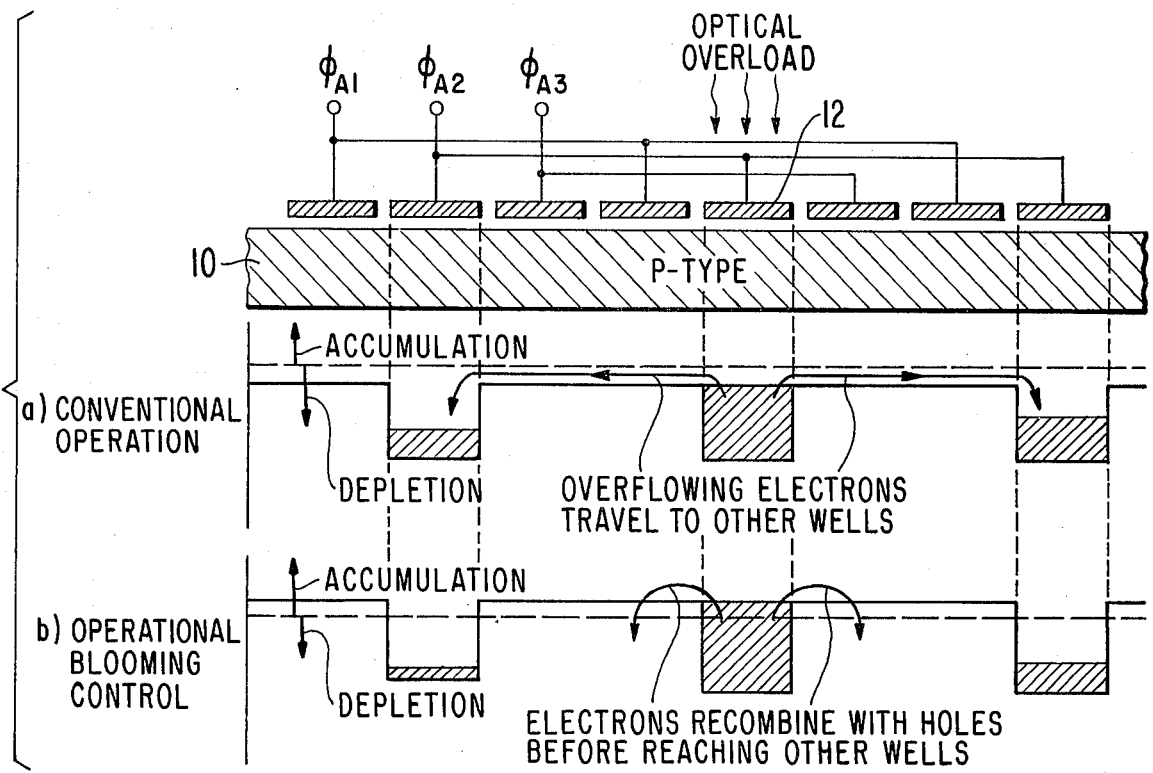

United States Patent [19]
Levine

[11] 3,931,465
[45] Jan. 6, 1976

[54] BLOOMING CONTROL FOR CHARGE COUPLED IMAGER

[75] Inventor: Peter Alan Levine, Kendall Park, N.J.

[73] Assignee: RCA Corporation, New York, N.Y.

[22] Filed: Jan. 13, 1975

[21] Appl. No.: 540,436

[52] U.S. Cl. .................... 178/7.1; 357/24; 357/30
[51] Int. Cl.² H04N 3/14; H01L 29/78; H01L 27/14
[58] Field of Search ................ 178/7.1; 357/24, 30; 340/173 LS, 173 LT, 166 R; 250/211 J, 211 R, 578; 307/311

[56] References Cited
UNITED STATES PATENTS

| | | | |
|---|---|---|---|
| 3,715,485 | 2/1973 | Weimer | 178/7.1 |
| 3,771,149 | 11/1973 | Collins et al. | 340/173 LT |
| 3,826,926 | 7/1974 | White et al. | 357/24 |
| 3,845,295 | 10/1974 | Williams et al. | 250/211 J |
| 3,863,065 | 1/1975 | Kosonocky | 250/211 J |
| 3,866,067 | 2/1975 | Amelio | 307/311 |

OTHER PUBLICATIONS

Sequin, "Blooming Suppression in Charge Coupled Area Imaging Devices," Bell System Tech. J., Vol. 51, No. 8, (Oct. 1972), pp. 1923–1926.

Primary Examiner—Robert L. Griffin
Assistant Examiner—John C. Martin
Attorney, Agent, or Firm—H. Christoffersen; S. Cohen

[57] ABSTRACT

An improved operational blooming control circuit for a charge coupled device image sensing array in which the "accumulated" regions of the substrate are driven into "depletion" at the end of the integration time and prior to the transfer of the contents of the A to the B registers. This is found to improve the resolution of the reproduced image.

2 Claims, 2 Drawing Figures

U.S. Patent    Jan. 6, 1976    3,931,465

BLOOMING CONTROL FOR CHARGE COUPLED IMAGER

When a photosensor array such as one of the charge coupled device (CCD) type is illuminated by a scene in which certain regions are much, much brighter than others, problems are created, that is, the portions of the array receiving the intense rediation may become overloaded. In the case of a CCD array, the intense radiant energy signal impinging on a particular location of the array results in the generation of much more charge signal than can be stored at that location. The excess charge tends to spread to the adjacent location or locations along the CCD channel and may also spread to the adjacent CCD channels. This spreading of charge manifests itself as "blooming" of the image which is read out of the array. In other words, the intense radiant energy source may appear, when read out and subsequently reproduced, to occupy a much larger area than that occupied by the original.

There are a number of ways the problem above may be dealt with. One is to employ so called "blooming buses" in the substrate which are operated in such a way that excess charge preferentially flows to these buses rather than to other energy sensing locations. Another is the so-called "operational blooming control". There, regions of the substrate adjacent to those where charge is sensed are held in accumulation, and excess charge (minority carriers) is caused to combine with the majority carriers present at such accumulated regions.

The present invention is an improved operational blooming control circuit. The improvement resides in driving the accumulated regions of the substrate into depletion at the end of the integration time and prior to the transfer of the contents of the imaging area (the A register) to the storage area (the B register). The result of operating in this way is to improve the resolution of the reproduced image. The reasons for such improvement are discussed below.

Figure 2:
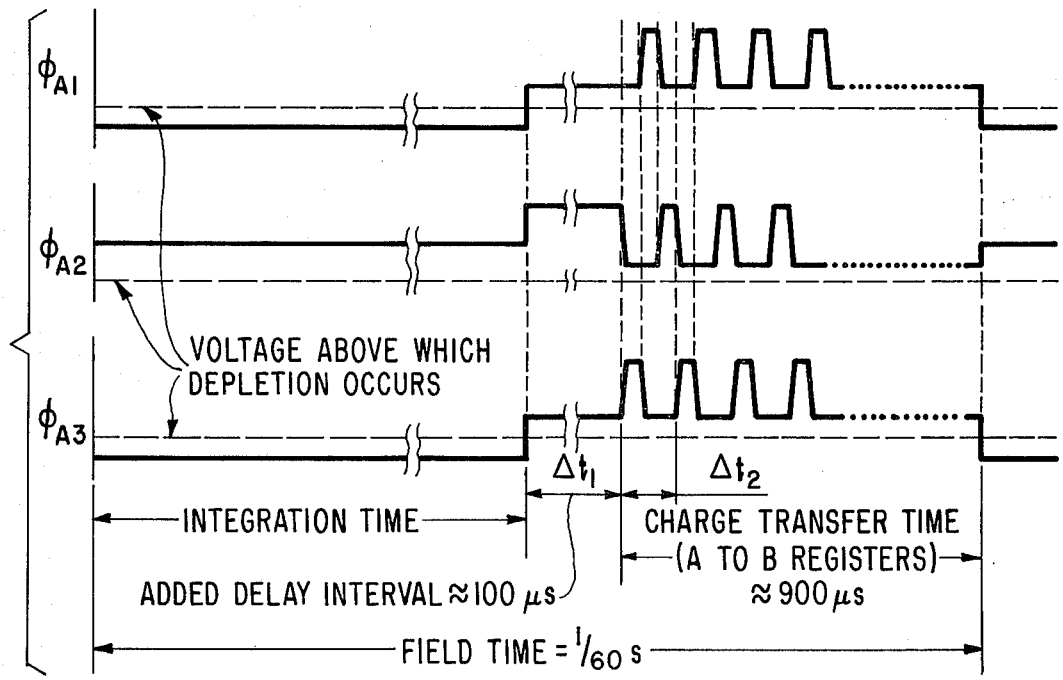

In the drawing:

FIG. 1 is a section through a CCD channel of an A register and illustrates also surface potential profiles for operating such a register in two different ways; and FIG. 2 is a drawing of waveforms to help explain the operation of a CCD image sensor in accordance with the present invention.

Referring first to the upper portion of FIG. 1, the CCD imager shown includes a P-type substrate 10 and a plurality of electrodes insulated from and capacitively coupled to the substrate. The showing is schematic in the sense that the insulation employed, which is normally silicon dioxide, is not shown specifically and the electrode structure is shown only schematically. The type of CCD chosen for illustration is a three phase device and in a practical circuit the electrodes may overlap one another. The present invention is applicable also to two or four or higher phase structures which are not illustrated specifically. Also, the substrate may be of N-type rather than P-type, provided supply voltages are chosen of appropriate polarity.

The structure shown in FIG. 1 may be assumed to constitute a portion of one vertical channel of the image sensing region of the array, sometimes also known as the A register. During one portion of the operating time, known as the "integration" time, when a scene is being imaged onto the array, one of the electrodes (the $\phi_{A2}$ electrodes in this example) may be maintained at a voltage to cause depletion regions to form beneath such electrodes and the remaining electrodes, namely the $\phi_{A1}$ and $\phi_{A3}$ electrodes, may be maintained at potentials such as to maintain the substrate regions beneath these electrodes in mild depletion. This is illustrated at $a$ in FIG. 1. The heavily depleted regions form potential wells in the substrate, that is, they form regions at the substrate surface from which majority carriers (holes) have been repelled and where minority carrier surface charge may accumulate. The lightly depleted regions of the substrate form potential barriers between the potential wells. Substantially no part of the substrate is in accumulation.

In operation, a radiation image is applied to the imager either through the electrodes, as illustrated schematically, or through the back surface of the substrate. (It may be assumed for purposes of the present discussion that the electrodes are substantially transparent to the radiation.)

In the event of an optical overload in the region, for example, of the $\phi_{A2}$ electrode 12, the potential well in the substrate beneath this electrode soon will overflow. The overflowing charge then can flow over the barriers beneath the $\phi_{A3}$ and $\phi_{A1}$ electrodes to the adjacent wells in the same channel and possibly (in cases of severe overload) also may flow to the potential wells in the adjacent channels (not shown). This phenomenon is known as blooming and, as mentioned in the introductory portion of this application, is highly undesirable.

One solution to the problem is to employ blooming control structures as mentioned briefly in the introductory portion of this application. Such structures are described, for example, in the article "Blooming Suppression in Charge Coupled Array Image Devices" by C. H. Sequin, Bell System Technical Journal, October 1972, page 1923.

FIG. 1 illustrates at $b$ a second solution to the problem; this solution is known as "operational" blooming control because no added structure is needed in the array. Here, during the integration time, the $\phi_{A1}$ and $\phi_{A3}$ electrodes are held at potentials such as to maintain the substrate regions between the potential wells in accumulation. In other words, the potentials are such that majority carriers (holes in this example) are present in these regions of the substrate. When an optical overload occurs under such conditions, the excess minority carriers (electrons in the present example) which flow from a filled potential well recombine with the majority carriers (holes) present in the accumulated regions. This greatly reduces the number of excess electrons which reach other potential wells and thereby reduces the tendency of the array to bloom.

Unfortunately, operating the array in the way just discussed introduces another problem. Because the regions between potential wells are operated in accumulation, at least the major portion of the minority carriers are removed from this region. Thus, when after the integration time the contents of the A register are shifted at high speed to the B register (not shown), there is no residual charge filling the so called "fast interface states" (charge traps at the semiconductor-insulator interface) in these regions of the substrate. Such residual charge (sometimes known as "fat zero" charge) has the important function of preventing, or at least substantially reducing, the loss of charge signal to such traps when the charge signal is being propagated along the channel by the three phase voltages. A more detailed discussion of this phenomenon, as applied to a CCD imager, appears in U.S. application Ser. No. 481,746, filed June 21, 1974 by the present inventor and assigned to the same assignee as the present application.

Thus, when a CCD array is operated in the manner shown at b in FIG. 1, a portion of the charge signals being propagated along the channel during the transfer of these charge signals to the B register becomes lost, that is, this portion of the charge signal becomes captured by the traps present in the surface of the substrate which previously was in accumulation. The result is loss of signal and subsequent release of spurious portions of the lost signal to following charge signals. The result is a smearing of the charge pattern, which manifests itself as a reduction in the resolution which is obtained in the subsequently reproduced image.

Moreover, in order to minimize as much as possible this undesired loss of resolution, the accumulated regions can be placed only in relatively mild accumulation—in some cases less than that actually desired fully to eliminate blooming. In a practical array operated in the manner shown at b in FIG. 1, it has been found that overloads of 15:1 to 20:1 can be handled. However, it has also been found that substantially higher optical overloads require that the substrate regions in accumulation be placed in such heavy accumulation that the resulting loss in resolution becomes intolerable.

FIG. 2 illustrates the improved method of operational blooming control of the invention. During the integration time, the $\phi_{A2}$ voltage is such that the substrate surface becomes depleted beneath the $\phi_{A2}$ electrodes, and the $\phi_{A3}$ and $\phi_{A1}$ voltages are such that the substrate surface beneath these electrodes becomes accumulated. However, the accumulation level can be substantially higher than that of the prior art as represented at b in FIG. 1.

At the end of the integration time the multiple phase voltages do not start immediately. Rather, the $\phi_{A1}$ and $\phi_{A3}$ electrodes are placed at voltage levels such that the substrate regions beneath these electrodes are driven into depletion. (This takes place during the interval $\Delta t_1$ of FIG. 2.) During this same interval $\Delta t_1$, the $\phi_{A2}$ voltage is made substantially more positive that it was previously, to increase the depth of the potential well and to thereby prevent the escape of any charge signal due to the lower potential barriers beneath the $\phi_{A1}$ and $\phi_{A3}$ electrodes. This added delay interval $\Delta t_1$ can be a time period such as 0.1ms (millisecond), that is, 100 $\mu$s (microseconds). During this period, as the substrate region beneath the $\phi_{A1}$ and $\phi_{A3}$ electrodes is in depletion, it gathers a residual charge. This residual charge mainly results from the radiation (light) reaching the substrate surface. Such light can be a bias light as described in my copending application identified above or it can simply be the background light which generally is available in any scene being viewed. Some of the charge signal which gathers also may be due to thermally generated charge.

When operated in the way discussed above and illustrated in FIG. 2, it is found that when the contents of the A register is transferred to the B register (not shown) by the three phase waveforms shown in FIG. 2, and the image stored in the B register subsequently is reproduced, the resolution of the reproduced image is exceptionally good. Moreover, it has been found possible to operate the CCD array with much heavier optical overloads than was previously possible. It was found that the CCD imager could withstand a 50:1 or so optical overload with hardly any blooming at all, whereas the previous limit, as already mentioned, was between 15 and 20 to 1.

To give some idea of the relative times involved in the operation depicted in FIG. 2, it may be assumed that the CCD array described is being operated at commercial television standards. Here, the field time is 1/60 second, the charge transfer time (during which the contents of the imaging array (A register) is transferred to the storage area (B register)) corresponds to the vertical retrace time and may be roughly 900 microseconds, and the integration time may be the remainder of the field time, i.e., the major part of 1/60 second.

In one practical array which was operated, $\Delta t_1$ was set at 100 microseconds and found to give the satisfactory performance desired. The time period can be increased if the substrate is operated in heavier accumulation during the integration time. If during $\Delta t_1$ the depletion depth beneath the $\phi_{A3}$ and $\phi_{A1}$ is further increased, the depth of the wells beneath the $\phi_{A2}$ electrodes should be increased correspondingly to prevent the loss of charge signal.

The time $\Delta t_2$ (the duration of one period of the multiple phase voltage) will depend, in part, on the number of rows in the A register. For a 200 row array, simple arithmetic shows that $\Delta t_2$ can be as long as somewhat over 4 $\mu$s; for a 500 row array, $\Delta t_2$ can be somewhat under 2 $\mu$s.

What is claimed is:

1. A method of controlling blooming in a charge coupled device image sensing array which includes a substrate and electrodes capacitively coupled to the substrate comprising the steps of:
    during the integration time, maintaining certain of the electrodes at a potential to create depletion regions in the substrate regions beneath these electrodes within which charge can be stored and maintaining other of the electrodes at a potential to create accumulation regions in the substrate between the depletion regions;
    at the end of the integration time and for a relatively short interval compared to the integration time, changing the potential on said other electrodes to a value to place the substrate regions formerly in accumulation into depletion and concurrently changing the potential applied to said certain electrodes to a value to drive the substrate regions beneath said certain electrodes into deeper depletion; and
    applying thereafter multiple phase voltages to said electrodes for propagating any stored charge along the substrate.

2. A charge coupled device imager comprising, in combination:
    a semiconductor substrate;
    a plurality of electrodes spaced from one another along a length of the substrate and capacitively coupled to said substrate;
    means, during an integration time, for maintaining certain spaced ones of said electrodes, having intervening electrodes between said spaced electrodes, at a potential to form depletion regions in the substrate and for maintaining said intervening electrodes at a potential to form accumulation regions in the substrate between the depletion regions; and means, during a relatively short interval following the integration time, compared to the integration interval, for changing the potential applied to said intervening electrodes to a value to form depletion regions in the substrate and for concurrently changing the potential applied to said certain electrodes to a value to drive the substrate beneath said certain electrodes into deeper depletion to thereby avoid the loss of charge signal from the substrate regions beneath said certain electrodes during said relatively short interval.

* * * * *